United States Patent
Houston

(10) Patent No.: US 7,385,841 B2
(45) Date of Patent: Jun. 10, 2008

(54) STATIC RANDOM ACCESS MEMORY DEVICE HAVING A VOLTAGE-CONTROLLED WORD LINE DRIVER FOR RETAIN TILL ACCESSED MODE AND METHOD OF OPERATING THE SAME

(75) Inventor: Theodore W. Houston, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 11/204,064

(22) Filed: Aug. 15, 2005

(65) Prior Publication Data

US 2007/0035987 A1 Feb. 15, 2007

(51) Int. Cl.
*G11C 11/00* (2006.01)

(52) U.S. Cl. ............. 365/154; 365/230.06; 365/230.03

(58) Field of Classification Search ........... 365/230.03, 365/230.06, 154
See application file for complete search history.

(56) References Cited

U.S. PATENT DOCUMENTS

| | | | | |
|---|---|---|---|---|
| 5,051,952 | A | * | 9/1991 | Gotou ........................ 365/154 |
| 5,687,178 | A | * | 11/1997 | Herr et al. .................. 365/201 |
| 2007/0002617 | A1 | * | 1/2007 | Houston et al. ....... 365/185.07 |

* cited by examiner

*Primary Examiner*—Thong Q. Le
(74) *Attorney, Agent, or Firm*—Frederick J. Telecky, Jr.; Wade J. Brady, III

(57) ABSTRACT

A static random-access memory (SRAM) device and a method of operating the same. In one embodiment, the SRAM device includes: (1) a row of SRAM cells coupled to a word line and a power source configured to vary in voltage to enable the row of SRAM cells to operate in a retain-till-accessed (RTA) mode and (2) a word line driver coupled to the power source and configured to drive the word line.

17 Claims, 4 Drawing Sheets

STATIC RANDOM ACCESS MEMORY DEVICE HAVING A VOLTAGE-CONTROLLED WORD LINE DRIVER FOR RETAIN TILL ACCESSED MODE AND METHOD OF OPERATING THE SAME

TECHNICAL FIELD OF THE INVENTION

The present invention is directed, in general, to Static Random Access Memory (SRAM) and, more specifically, a SRAM device having a voltage-controlled word line driver for a retain till accessed (RTA) mode and method of operating the same.

BACKGROUND OF THE INVENTION

Different types of memory are used in electronic apparatus for various purposes. Read-only memory (ROM) and random-access memory (RAM) are two such types of memory commonly used within computers for different memory functions. ROM retains its stored data when power is switched off and therefore is often employed to store programs that are needed for powering-up an apparatus. ROM, however, does not accommodate writing. RAM, on the other hand, allows data to be written to or read from selected addresses associated with memory cells and, therefore, is typically used during normal operation of the apparatus.

Two common types of RAM are dynamic RAM (DRAM) and static RAM (SRAM). DRAM is typically used for the main memory of computers or other electronic apparatuses since, though it must be refreshed, it is typically inexpensive and requires less chip space than SRAM. Though more expensive and space-consumptive, SRAM does not require refresh, making it faster. These attributes make SRAM devices particularly desirable for portable equipment, such as laptop computers and personal digital assistants (PDAs).

A typical SRAM device includes an array of addressable memory cells arranged in columns and rows. A typical SRAM cell includes two access transistors and a flip-flop formed with two cross-coupled inverters. Each inverter has a pull-down (driver) and a pull-up (load) transistor. The gates of the access transistors in each row are connected to a word line and the sources of each of the access transistors in each column are connected to either one of a pair of complementary bit lines, BL or BL_. Peripheral circuitry associated with the rows (or word lines) and peripheral circuitry associated with the columns (or bit lines) facilitate reading data from, and writing data to, the SRAM cells.

Generally, to read data from a SRAM cell, a word line driver activates a word line according to an address decoded by a row decoder and received via a control signal path that typically includes an address bus connected to the SRAM device. The access transistors turn on and connect the outputs of the flip-flop to the bit line pair sending control signals representing the data in the SRAM cell to a sense amplifier coupled to the bit line pair. The sense amplifier produces a logical 0 or 1 from the potential difference on the bit line pair, which is, in turn, provided to external circuitry of the associated electronic apparatus, perhaps through a buffer.

As mentioned above, to retain the data written to the SRAM array, each SRAM cell must have a continuous supply of power. SRAM devices, however, are often employed within battery-powered wireless apparatus where power consumption is an important design parameter. Accordingly, SRAM devices are often capable of operating in multiple modes, each mode representing a tradeoff in terms of speed and power consumption. One such mode is the active mode. In the active mode, the SRAM array and surrounding read and write circuitry are provided full power. The array and circuitry are therefore ready for operation at all times, and read and write speed is the fastest. Another mode is the inactive, or sleep, mode. In the inactive mode, the SRAM array is provided power so as not to lose data, but at a reduced voltage to reduce power consumption. In the inactive mode, all of the surrounding read and write circuitry are turned off for maximum power reduction. The surrounding read and write circuitry must be turned back on before reading or writing can occur, and so there is a latency in initiating reading or writing from the inactive mode.

Another mode of operation represents a middle ground between active mode and inactive mode. Retain Till Accessed (RTA) mode calls for the read and write circuitry to remain powered. The SRAM array itself is powered at a reduced voltage sufficient to retain the stored data, but insufficient to allow reliable read or write access. When a read and write access is to be done, only the cells needed for the access are activated; the remaining cells are retained at lower voltage.

Though the RTA mode represents a decrease in latency over the inactive mode, keeping the periphery circuitry powered adds significant power relative to the inactive mode. Furthermore, the stability of the SRAM array may be compromised by voltage mismatches occurring between word line drivers and cells that are activated or deactivated.

Accordingly, what is needed in the art is a way to decrease power in associated periphery circuitry in the RTA mode. More specifically, what is needed in the art is an efficient way to control the voltage of the word line drivers such that they can be reactivated quickly, easily and without introducing substantial voltage mismatches that may compromise SRAM array stability, yet decrease the contribution to power dissipation in the RTA mode.

SUMMARY OF THE INVENTION

To address the above-discussed deficiencies of the prior art, the present invention provides, in one aspect, an SRAM device. In one embodiment, the SRAM device includes: (1) a row of SRAM cells coupled to a word line and a power source configured to vary in voltage to enable the row of SRAM cells to operate in an RTA mode and (2) a word line driver coupled to the power source and configured to drive the word line.

In another aspect, the present invention provides a method of operating an SRAM device. In one embodiment, the method includes: (1) varying a voltage of a power source to enable a row of SRAM cells coupled to a word line and the power source to operate in an RTA mode and (2) driving the word line with a word line driver coupled to the power source.

In yet another aspect, the present invention provides an SRAM device. In one embodiment, the SRAM device includes: (1) an SRAM array having a plurality of SRAM cells arranged in rows and coupled to word lines, (2) power sources associated with ones of the rows and configured to vary in voltage to enable the ones to operate in an RTA mode and (3) word line drivers coupled to the power sources, associated with each of the rows and configured to drive corresponding word lines only when the rows are selected for access.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the invention, reference is now made to the following descriptions taken in conjunction with the accompanying drawing, in which.

DETAILED DESCRIPTION

Figure 1:
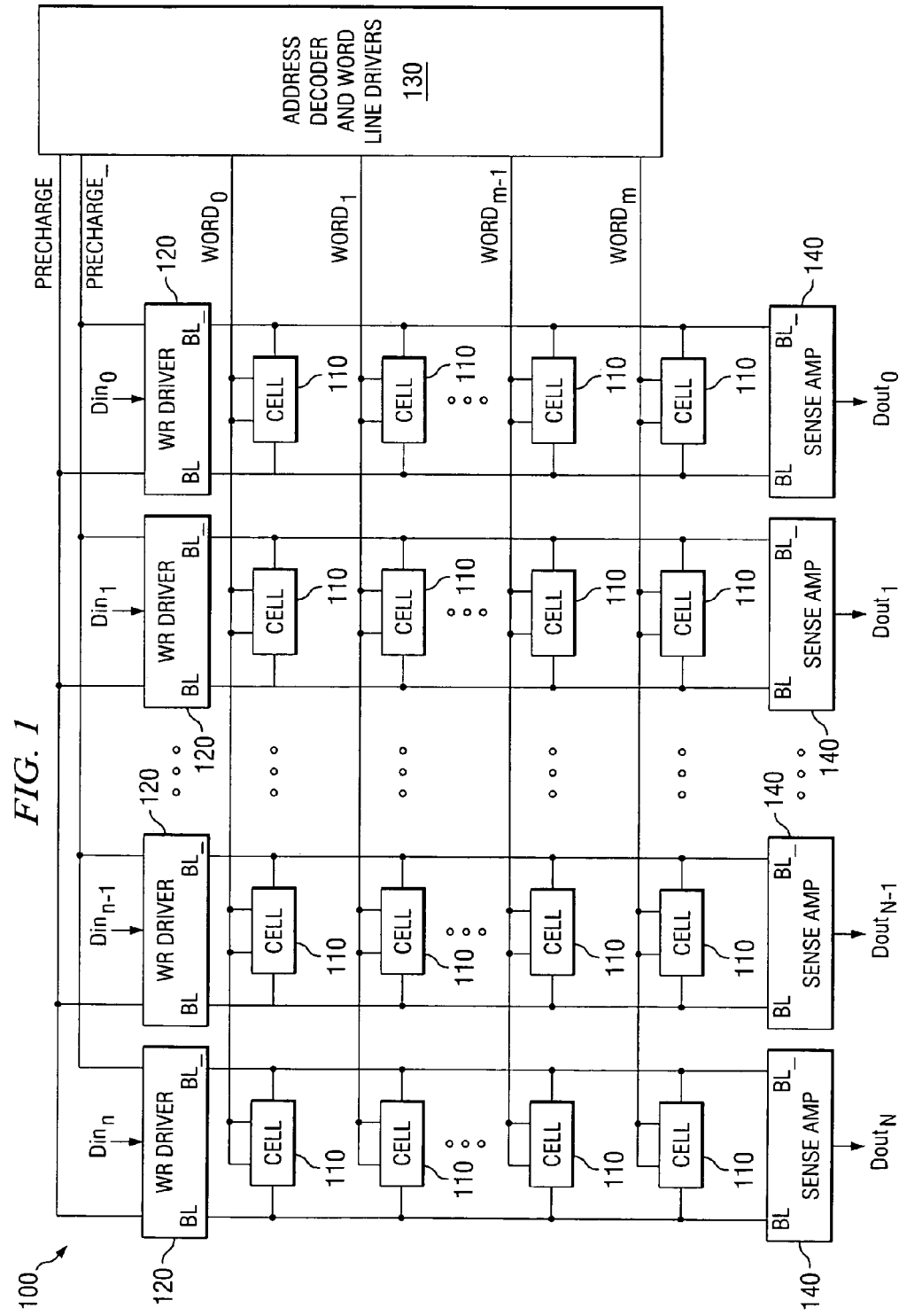
FIG. 1 illustrates a block diagram of one embodiment of a SRAM array having a voltage-controlled word line driver for RTA mode constructed according to the principles of the present invention.

Referring initially to FIG. 1, illustrated is a block diagram of one embodiment of a SRAM array having a voltage-controlled word line driver for RTA mode constructed according to the principles of the present invention.

The SRAM device, generally designated 100, includes an array of addressable memory cells 110 arranged in columns and rows. For purposes of the present discussion, each SRAM cell 110 will be assumed to be conventional in construction and operation. Therefore, each SRAM cell 110 includes two access transistors and a flip-flop formed with two cross-coupled inverters (not shown, but well known to those skilled in the art). Each inverter has a pull-down (driver) and a pull-up (load) transistor. The gates of the access transistors in each row are connected to a word line (e.g., $Word_0$, $Word_1$, ... $Word_{m-1}$, $Word_m$). The sources of each of the access transistors in each column are connected to either one of a pair of complementary bit lines BL, BL_. Peripheral circuitry associated with the rows (or word lines) and peripheral circuitry associated with the columns (or bit lines) facilitate reading data from, and writing data to, the SRAM cells 110.

To write data to the SRAM array, write drivers 120 cause logical 0s or 1s ($Din_0$, $Din_1$, ... $Din_{n-1}$, $Din_n$) to be written to SRAM cells 110 in a particular row in accordance with an address. An address is supplied and decoded, and a word line driver in the address decoder and word line drivers 130 drives the appropriate word line (from among $Word_0$, $Word_1$, ... $Word_{m-1}$, $Word_m$) to effect access to the row of SRAM cells corresponding to the address. Although not shown in FIG. 1, the word line drivers 120 are voltage-controlled in accordance with the principles of the present invention.

To read data from a SRAM cell 110, SRAM cells 110 in a particular row defined in accordance with an address as decoded by the address decoder 130 are coupled to respective complementary bit lines BL, BL_ which, in turn, are coupled to sense amplifiers 140 coupled to the bit lines BL, BL_.

The sense amplifiers 140 produce logical 0s or 1s from the potential difference on the bit lines and complementary bit lines. The sense amplifiers 140 in turn provide the logical 0s or 1s ($Dout_0$, $Dout_1$, ... $Dout_{N-1}$, $Dout_N$) to external circuitry of the associated electronic apparatus, perhaps through a buffer.

The SRAM device is capable of operating in an RTA mode. In an RTA mode, some portion of the cells not addressed are held at a reduced power mode relative to cells that are addressed. An RTA controller typically performs the task of powering the appropriate portions of the SRAM array at appropriate levels. Those skilled in the art are familiar with the RTA mode in general.

As described above, the peripheral circuitry (e.g., the drivers and sense amplifiers) surrounding the SRAM array are also advantageously powered only when needed. Optimally, only the drivers and sense amplifiers needed to write or read data to the affected SRAM cells are actually powered; the rest remain off.

Unfortunately, turning peripheral circuitry on and off to save power brings about three problems. The first problem is that additional switches or interruptible power sources must be provided for the peripheral circuitry. The second problem is that restoring power to peripheral circuitry takes time. The third problem is that voltage mismatches may occur if the peripheral circuitry is powered at a voltage that differs from the voltage that powers the portion of the SRAM array to which it is coupled. Quickly coupling peripheral circuitry that has just been turned on to its associated SRAM cells that have just been fully powered increases the chance of a voltage mismatch occurring. Voltage mismatches are to be avoided, since they may destabilize one or more SRAM cells and cause data loss. Alternatively, voltage mismatch could cause failures to write or failures in reading.

The present invention is directed in general to enabling the reduction of power to unaddressed word line drivers such that they can be powered down in the RTA mode, yet be reactivated quickly, easily and without introducing substantial voltage mismatches that may compromise SRAM array stability. Certain embodiments of the present invention achieve this objective by driving the peripheral circuitry with the same power source that drives its associated SRAM cells. Other embodiments of the present invention achieve this objective by driving the peripheral circuitry and the SRAM cells with separate power sources, but still reducing power to unaddressed word line drivers. In other words, the same power source ($V_{ddi}$–$V_{ssi}$) that drives a row or block (more than one row) of SRAM cells also provides power to the word line driver(s) that drive(s) the word lines associated with the row or block. The various power sources used to provide power to corresponding various portions of the SRAM array vary in voltage to enable the SRAM array to operate in RTA mode. The word line drivers are configured to drive corresponding word lines only when corresponding rows or blocks are selected for access. The structure and operation of peripheral circuits that take advantage of the teachings of the present invention will now be described in conjunction with FIGS. 2 and 3.

Figure 2:
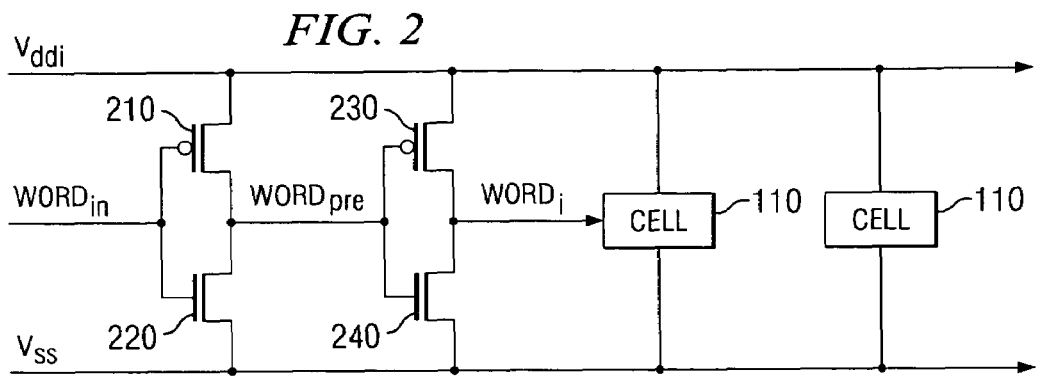
FIG. 2 illustrates a schematic and block diagram of a portion of the SRAM array of FIG. 1 showing, in particular, one embodiment of a word line driver constructed according to the principles of the present invention.

Turning now to FIG. 2, illustrated is a schematic and block diagram of a portion of the SRAM array of FIG. 1 showing, in particular, one embodiment of a word line driver constructed according to the principles of the present invention. FIG. 2 shows two representative SRAM cells 110 constituting a portion of a row which may itself be a portion of a block of rows that can be separately placed in an RTA mode. A word line carries a signal, $Word_{out}$, to drive access transistors associated with each of the SRAM cells 110 as described above. A power source, $V_{dd}$, $V_{ss}$, is configured to vary in voltage to enable the row or block of SRAM cells 110 to operate in the RTA mode. A few alternative ways in which the power source can vary in voltage will be described below.

A word line driver is coupled to the power source $V_{dd}$, $V_{ss}$, and is configured to drive the word line. In the illustrated embodiment, the word line driver is formed by a p-channel transistor 230 and an n-channel transistor 240 coupled in series to the power source, $V_{dd}$, $V_{ss}$.

A word line predriver is also coupled to the power source $V_{dd}$, $V_{ss}$, in parallel with the word line driver. In the illustrated embodiment, the word line predriver is formed by a p-channel transistor 210 and an n-channel transistor 220 coupled in series to the power source $V_{dd}$, $V_{ss}$.

A signal, $Word_{in}$, opens or closes the transistors 210, 220 in the word line predriver, causing the word line predriver to generate an intermediate signal, $Word_{pre}$, at its output. The intermediate signal $Word_{pre}$, in turn opens or closes the transistors 230, 240 in the word line driver, causing the word line driver to generate the signal $Word_{out}$ that is conveyed on the appropriate word line to the various access transistors in the SRAM cells 110.

The voltage difference $V_{dd}$-$V_{ss}$ in the power source of course determines the power dissipation of the word line predriver and word line driver. Therefore, in RTA mode, when $V_{dd}$ is decreased to a lower level (by an RTA controller as those skilled in the art are aware), power dissipation in the word line predriver and word line driver is also decreased automatically and without requiring a separate power supply. Further, as $V_{dd}$ is increased to enable writing or reading with respect to the SRAM cells 110, voltage mismatches between the word line driver and the SRAM cells 110 are reduced and most advantageously eliminated, because $V_{dd}$ is common to both.

In the embodiment of FIG. 2, the SRAM cells are part of the same row; thus the power source $V_{dd}$, $V_{ss}$, provides power only to that row of SRAM cells. Alternatively, the SRAM cells may be in different (e.g., adjacent) rows, which would require word line driver for each row. In the latter case, the power source $V_{dd}$, $V_{ss}$, provides power to a block of rows of SRAM cells.

Figure 3:
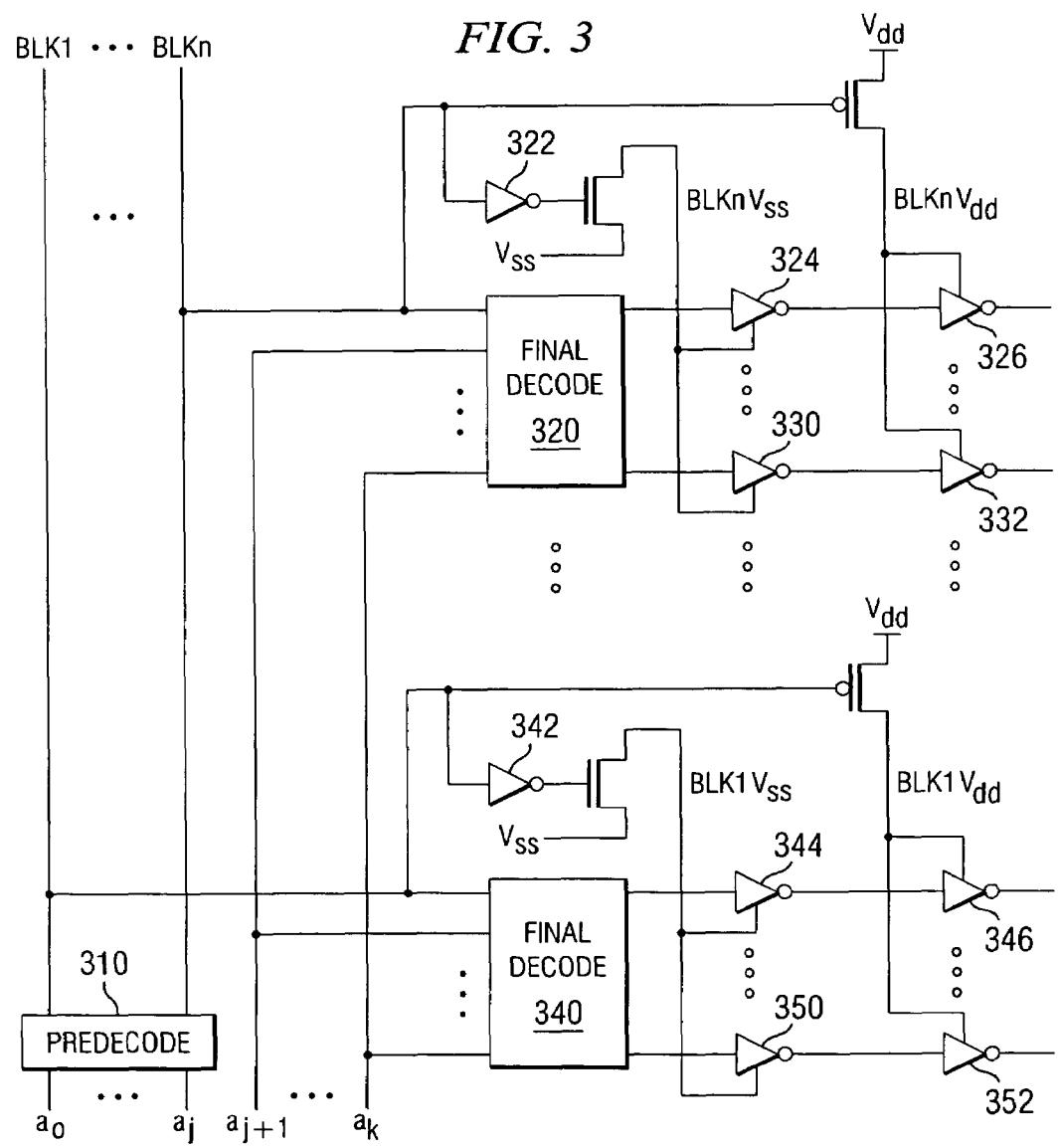
FIG. 3 illustrates a schematic and block diagram of a portion of the SRAM array of FIG. 1 showing, in particular, an alternative embodiment in which $V_{dd}$ is controlled by block to activate a word line driver and $V_{ss}$ is controlled by block to activate a word line predriver.

Turning now to FIG. 3, illustrated is a schematic and block diagram of a portion of the SRAM array of FIG. 1 showing, in particular, an alternative embodiment in which $V_{dd}$ is controlled by block to activate a word line driver and $V_{ss}$ is controlled by block to activate a word line predriver. A predecode block 310 and final decode blocks 320, 340 form at least part of a row address decode circuit. Address lines $a_0 \ldots a_j$ are provided to the predecode block 310, which produces Blk1 . . . Blkn signals that selectively activate corresponding blocks Blk1 . . . Blkn. Remaining address lines $a_{j+1} \ldots a_k$ are provided to the final decode blocks 320, 340 that are associated with Blkn and Blk1, respectively.

FIG. 3 divides a SRAM array of m×n rows into m blocks of n rows each. Block enable signals Blk1_, Blk2_, . . . , Blkm_ (generically, Blki_) enable word drivers for corresponding blocks. When Blki_ is low, $V_{dd}$ is supplied to the word line drivers in block i. For example, with respect to Blkn, the Blkn signal activates a driver 322, which, in turn activates a word line predriver 324, 330 by controlling $V_{ss}$ and a word line driver 326, 332 by controlling $V_{dd}$. Likewise, with respect to Blk1, the Blk1 signal activates a driver 342, which, in turn activates a word line predriver 344, 350 and a word line driver 346, 352.

Because each cutoff transistor serves a whole block instead of only one row, the SRAM array requires fewer cutoff transistors. Optionally, the row address decode is done in two stages, a predecode and a final decode, where the predecode result selects a block of rows within the array and the final decode selects one row from within the block of rows. The RTA block selection can correspond to the predecode selection. Since the predecode precedes the final decode, the restoration of active power to the selected block starts before the activation of the selected word line driver, reducing or eliminating any latency for restoration of selected power to the selected block. In any case, with RTA by block, the address space of the blocks is 1/n times the address space of the rows, making address decoding faster and reducing RTA latency.

Figure 4:
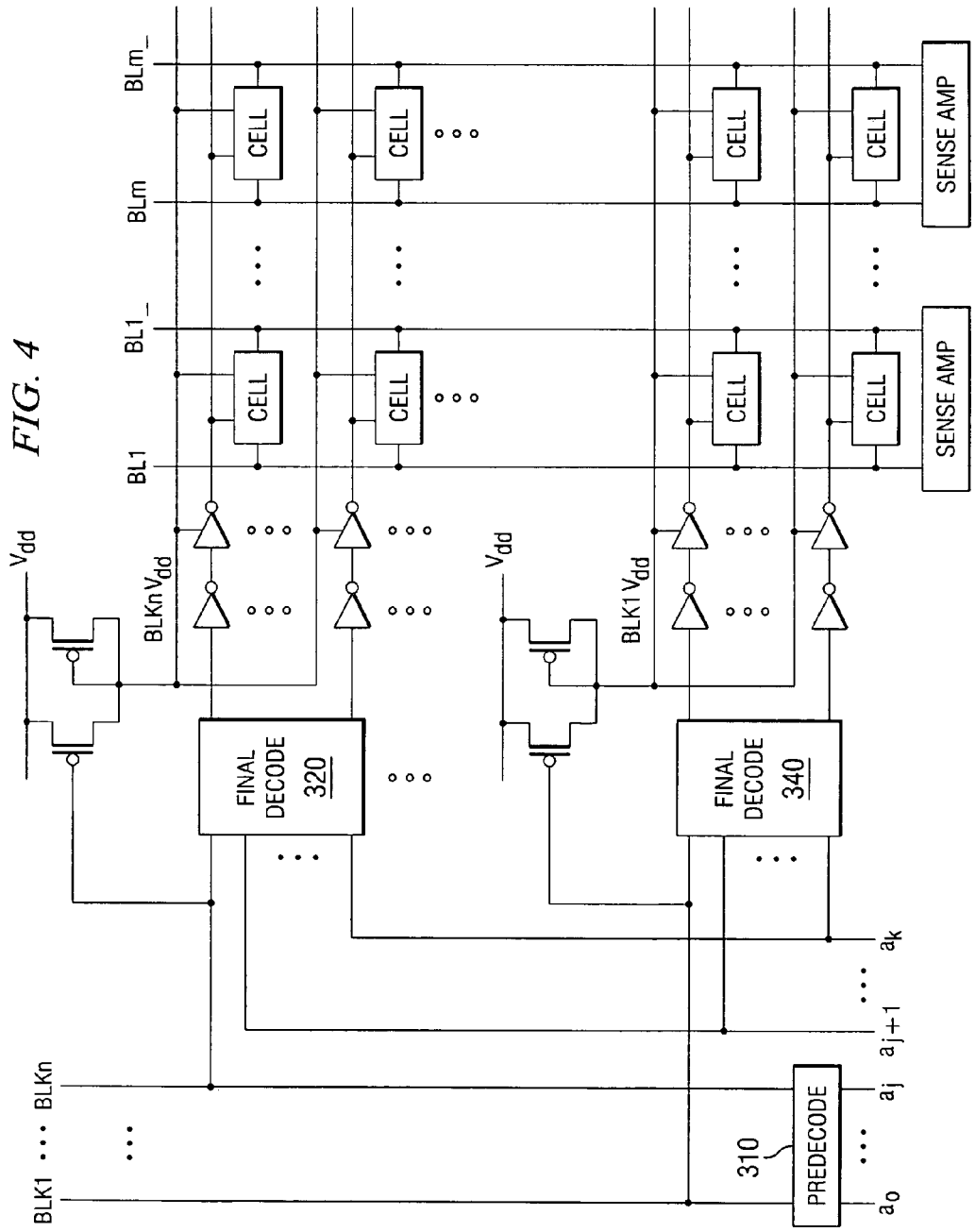
FIG. 4 illustrates a schematic and block diagram of a portion of the SRAM array of FIG. 1 showing, in particular, an alternative embodiment in which $V_{dd}$ is controlled by block and wherein $V_{dd}$ is common to the word line driver and associated cells.

Turning now to FIG. 4, illustrated is a schematic and block diagram of a portion of the SRAM array of FIG. 1 showing, in particular, an alternative embodiment in which $V_{dd}$ is controlled by block and wherein $V_{dd}$ is common to the word line driver and associated cells. As with FIG. 3, address lines $a_0 \ldots a_j$ are provided to a predecode block 310 which produces Blk1 . . . Blkn signals that selectively activate corresponding blocks Blk1 . . . Blkn. Remaining address lines $a_{j+1} \ldots a_k$ are provided to final decode blocks 320, 340 that are associated with Blkn and Blk1, respectively. In FIG. 4, the Blki signal controls $V_{dd}$ to not only activate the word line drivers, but also the SRAM cells in the corresponding block.

Figure 5:
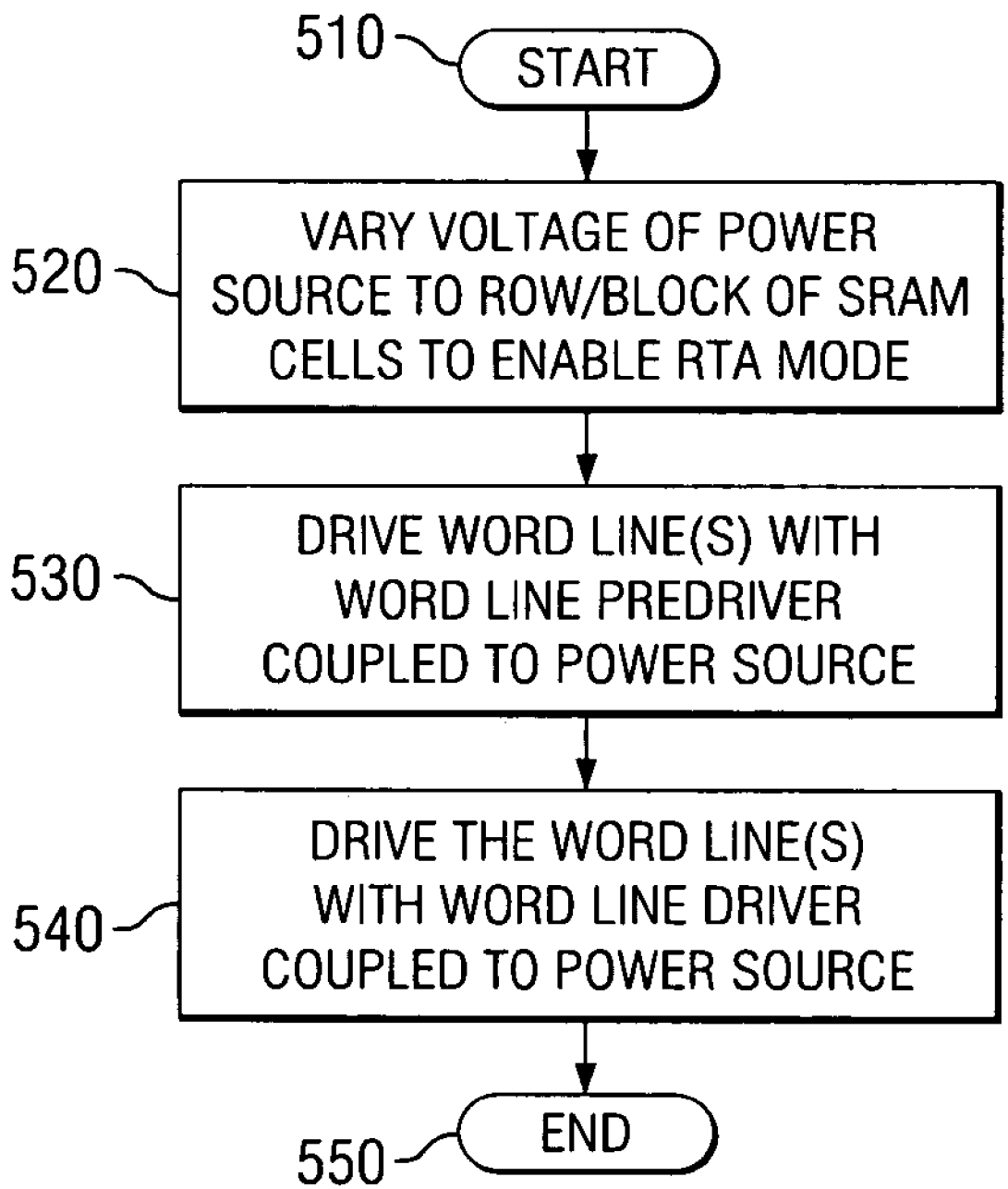
FIG. 5 illustrates a flow diagram of one embodiment of a method of operating a word line driver carried out according to the principles of the present invention.

Turning now to FIG. 5, illustrated is a flow diagram of one embodiment of a method of operating a word line driver carried out according to the principles of the present invention. The method begins in a start step 510 in which it is desired to perform an access (read or write) with respect to a SRAM device operating in an RTA mode. More specifically, it is desired to perform the access with respect to only a portion (row or block) of the SRAM device and, consequently, to activate only a portion of the SRAM device and leave the rest inactive.

In a step 520, a voltage of a power source associated with a particular row or block of SRAM cells is increased thereby to enable the row or block. Because the power source is also coupled to the word line driver (and word line predriver in those embodiments containing such), the voltage increase also enables these to operate.

Accordingly, in a step 530, the word line coupled to the corresponding SRAM cells are driven (through the word line driver) with a word line predriver coupled to the power source. In a step 540, the word line is further driven with a word line driver coupled to the power source. At this point, the access (read or write) can take place. The method end in an end step 550.

Although the present invention has been described in detail, those skilled in the art should understand that they can make various changes, substitutions and alterations herein without departing from the spirit and scope of the invention in its broadest form.

What is claimed is:

1. A static random-access memory (SRAM) device, comprising:
    a row of SRAM cells coupled to a word line and a power source configured to vary in voltage to enable said row of SRAM cells to operate in a retain-till-accessed (RTA) mode; and
    a word line driver powered by said power source and configured to drive said word line.

2. The SRAM device as recited in claim 1 further comprising a word line predriver powered by said power source in parallel with said word line driver.

3. The SRAM device as recited in claim 1 further comprising a cutoff switch coupled to said word line driver and configured to be off unless said row of SRAM cells is selected for access.

4. The SRAM device as recited in claim 3 wherein said cutoff switch is configured to regulate power to a plurality of word line drivers associated with a block of rows including said row.

5. The SRAM device as recited in claim 1 wherein said power source provides power only to said row of SRAM cells.

6. The SRAM device as recited in claim 1 wherein said power source provides power to a block of SRAM cells including said row of SRAM cells.

7. A static random-access memory (SRAM) device, comprising:
    a block of SRAM cells coupled to word lines and a power source;
    word line drivers powered by said power source and configured to drive said word lines; and
    a row address decode circuit comprising a predecode block configured to select said block of SRAM cells and configured to cause said word line drivers to operate said block of SRAM cells in a retain-till-accessed (RTA) mode.

8. A method of operating a static random-access memory (SRAM) device, comprising:
    varying a voltage of a power source to enable a row of SRAM cells coupled to a word line and said power source to operate in a retain-till-accessed (RTA) mode; and
    driving said word line with a word line driver powered by said power source.

9. The method as recited in claim 8 further comprising further driving said word line with a word line predriver powered by said power source in parallel with said word line driver.

10. The method as recited in claim 8 further comprising turning off a cutoff switch coupled to said word line driver unless said row of SRAM cells is selected for access.

11. The method as recited in claim 8 wherein said power source provides power only to said row of SRAM cells.

12. The method as recited in claim 8 wherein said power source provides power to a block of SRAM cells including said row of SRAM cells.

13. A static random-access memory (SRAM) device, comprising:
    an SRAM array having a plurality of SRAM cells arranged in rows and coupled to word lines;
    power sources associated with ones of said rows and configured to vary in voltage to enable said ones to operate in a retain-till-accessed (RTA) mode; and
    word line drivers coupled to and powered by said power sources, associated with each of said rows and configured to drive corresponding word lines only when said rows are selected for access.

14. The SRAM device as recited in claim 13 further comprising word line predrivers associated with said word line drivers.

15. The SRAM device as recited in claim 13 further comprising cutoff switches coupled to said word line drivers and configured to turn off unless corresponding rows of SRAM cells are selected for access.

16. The SRAM device as recited in claim 14 wherein each of said power sources provides power only to one of said rows.

17. The SRAM device as recited in claim 14 wherein each of said power sources provides power to a block of multiple of said rows of SRAM cells.

* * * * *